US008786351B2

(12) United States Patent
Chen

(10) Patent No.: US 8,786,351 B2
(45) Date of Patent: Jul. 22, 2014

(54) LEVEL SHIFTER

(71) Applicant: Raydium Semiconductor Corporation, Hsinchu (TW)

(72) Inventor: Ying-Lieh Chen, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/032,036

(22) Filed: Sep. 19, 2013

(65) Prior Publication Data

US 2014/0015588 A1 Jan. 16, 2014

Related U.S. Application Data

(62) Division of application No. 13/363,750, filed on Feb. 1, 2012, now Pat. No. 8,618,861.

(30) Foreign Application Priority Data

Feb. 1, 2011 (TW) .............................. 100103846 A

(51) Int. Cl.
*H03L 5/00* (2006.01)

(52) U.S. Cl.
USPC ............................................. 327/333; 326/81

(58) Field of Classification Search
USPC ........ 327/108, 112, 333, 427; 326/68, 80, 81; 365/189.11
See application file for complete search history.

(56) References Cited

U.S. PATENT DOCUMENTS 5,406,141 A * 4/1995 Yero et al. ........................ 326/68
7,884,646 B1 * 2/2011 Bourstein ........................ 326/81

* cited by examiner

*Primary Examiner* — Long Nguyen

(57) ABSTRACT

A level shifter is disclosed and includes at least four Type 1 transistors and at least four Type 2 transistors. The sources of several Type 1 transistors are electrically connected to a first voltage terminal while the sources of several Type 2 transistors are connected to a second voltage terminal. The level shifter receive an input signal and outputs a logically equivalent output signal with higher voltage, wherein the voltage of the output signal is between the voltages of the first voltage terminal and the second voltage terminal.

1 Claim, 11 Drawing Sheets

100 # LEVEL SHIFTER

BACKGROUND OF THE INVENTION

1. Field of the Invention

This invention relates to a level shifter that can output signals with increased voltage but at the same level, based on the input signal received. This invention specifically relates to a level shifter that receive a high level input signal and a low level input signal and then generate a high voltage output signal and a low voltage output signal simultaneously.

2. Description of the Related Art

Level shifter is an important element which is used to shift the digital signals from one voltage to another voltage. Therefore, the level shifter is often disposed between two digital modules corresponding to two different interface voltages in order to convert the voltage of one signal generated by one digital module to a voltage that another digital module can process.

FIG. 1 is a circuit diagram illustrating a conventional level shifter 10. As FIG. 1 shows, the conventional level shifter 10 includes a first transistor 20, a second transistor 21, the third transistor 22, a fourth transistor 23, and an inverter 40, wherein the first transistor 20 and the second transistor 21 are P-Type Metal-Oxide-Semiconductor Field-Effect Transistors (PMOS-FETs). On the other hand, the third transistor 22 and the fourth transistor 23 are N-Type Metal-Oxide-Semiconductor Field-Effect Transistors (NMOS-FETs).

As FIG. 1 shows, the sources of both the first transistor 20 and the second transistor 21 are connected to the first voltage terminal Vp. In addition, the drains of both the first transistor 20 and the second transistor 21 are connected to the drains of the third transistor 22 and the fourth transistor 23. The gate of the first transistor 20 is connected to the drain of the second transistor 21. Similarly, the gate of the second transistor 21 is connected to the drain of the first transistor 20. Furthermore, the sources of the third transistor 22 and the fourth transistor 23 are both connected to a second voltage terminal Vn, wherein the first voltage terminal Vp and the second voltage terminal Vn establish the potential difference required by the conventional level shifter 10.

The first input terminal Vin1 of the conventional level shifter 10 accepts digital signals to be converted and then transmits the digital signal to the gate of the third transistor 22 in order to control the conduction of the third transistor 22. Furthermore, the inverter 40 will transmit a digital signal, whose polarity is opposite to that of the input digital signal, to the gate of the fourth transistor 23. In this way, when the voltage at the first input terminal Vin1 is logically high, the voltage at the second input terminal Vin2 will be logically low. Thus, the conventional level shifter 10 controls the first transistor 20, the second transistor 21, the third transistor 22, and the fourth transistor 23 based on the voltages of the first input terminal Vin1 and the second input terminal Vin2, so that the drains of the second transistor 21 and the fourth transistor 23 can output signals Vout whose voltages are higher than that at the first input terminal Vin1.

On the other hand, when the voltage at the first input terminal Vin1 is logically low, the voltage at the second input terminal Vin2 is logically high because the input terminal of the inverter 40 is connected to the first input terminal Vin1. This allows the conventional level shifter 10 to control the first transistor 20, the second transistor 21, the third transistor 22, and the fourth transistor 23 so that the conventional level shifter 10 can generate a logically low output signal Vout at the drains of the second transistor 21 and the fourth transistor 23, wherein the voltages of the input signal Vin1 and the output signal Vout are substantially equal to the voltage at the second voltage terminal Vn.

However, when the input signal Vin1 switches from logically high to logically low or from logically low to logically high, the voltage between the gate and the drain of the second transistor 21 and the voltage between the gate and the drain of the fourth transistor 23 will start seesawing with each other. Therefore, the conventional level shifter 10 needs to wait for the transistor to complete the conduction process before the output signal can switch between polarities. In this way, the time required by the conventional level shifter 10 illustrated in FIG. 1 to switch the polarity of the output signal may exceed specifications.

FIG. 2 is a circuit diagram illustrating another conventional level shifter 11. The conventional level shifter 11 illustrated in FIG. 2 further includes a fifth transistor 24 and a sixth transistor 25. The source and the drain of the fifth transistor 24 are connected to the drain of the first transistor 20 and the drain of the third transistor 22 respectively, wherein the gate of the first transistor 20 is connected to the drains of the fourth transistor 23 and the sixth transistor 25. Furthermore, the source and the drain of the sixth transistor 25 are connected to the drains of the second transistor 21 and the fourth transistor 23 respectively, wherein the gate of the second transistor 21 is connected to the drains of the third transistor 22 and the fifth transistor 24.

The operation of the conventional level shifters 10 illustrated in FIG. 1 and FIG. 2 are substantially the same. When the input signal at the first input terminal Vin1 is logically high, the drains of the fourth transistor 23 and the sixth transistor 25 will generate a logically high output signal Vout whose voltage is higher than the input voltage Vin1. On the other hand, when the voltage at the first input terminal Vin1 is logically low, a logically low output signal Vout will be generated at the drains of the fourth transistor 23 and the sixth transistor 25, wherein the voltage of the output signal is substantially equal to that at the second voltage terminal Vn.

Furthermore, as FIG. 2 shows, the gates of the fifth transistor 24 and the sixth transistor 25 both accept a bias signal $V_B$ that is used to increase the potential difference between the gate and the drain of the third transistor 22 as well as between the gate and the drain of the fourth transistor 23, in order to reduce the time for the output signal Vout to switch between polarities when the input signal Vin1 switches between polarities. However, the conventional level shifter 11 illustrated in FIG. 2 needs to provide an extra bias signal $V_B$ and therefore may consume more power compared with the conventional level shifter 10 illustrated in FIG. 1.

This shows that how to improve the transition speed of output signal Vout while reducing the power consumption is one of many important issues for the level shifter.

SUMMARY OF THE INVENTION

It is an objective of the present invention to provide a level shifter which receives a digital input signal and outputs a logically equivalent digital output signal with higher voltage.

It is another objective of the present invention to provide a level shifter which receives a digital input signal and outputs a logically opposite digital output signal with higher voltage.

The level shifter of the present invention includes a plurality of Type 1 transistors and a plurality of Type 2 transistors. Each of the Type 1 transistors and the Type 2 transistors has a source, a gate, and a drain, wherein the Type 1 transistors are preferably P-channel Metal-Oxide-Semiconductor Field-Effect Transistor (P-channel MOS-FET) while the Type 2 transistors are preferably N-channel Metal-Oxide-Semiconductor Field-Effect Transistor (N-channel MOS-FET). The Type 1 transistors preferably include a first Type 1 transistor, a second Type 1 transistor, a third Type 1 transistor, and a fourth Type 1 transistor. The Type 2 transistors include a firs Type 2 transistor, a second Type 2 transistor, a third Type 2 transistor, and a fourth Type 2 transistor.

In preferred embodiments, the sources of both the first Type 1 transistor and the second Type 1 transistor are connected to a first voltage terminal. The source of the third Type 1 transistor is connected to the drain of the first Type 1 transistor. The gate and the drain of the third Type 1 transistor are connected to the gate of the second Type 1 transistor. The source of the fourth Type 1 transistor is connected to the drain of the second Type 1 transistor. The gate and the drain of the fourth Type 1 transistor are connected to the gate of the first Type 1 transistor.

Furthermore, the drain and the gate of the first Type 2 transistor are connected to the drain and the gate of the third Type 1 transistor. The drain and the gate of the second Type 2 transistor are connected to the gate and the drain of the fourth Type 1 transistor. The drain and the gate of the third Type 2 transistor are connected to the source of the first Type 2 transistor and a first input terminal respectively. The drain and the gate of the fourth Type 2 transistor are connected to source and a second input terminal respectively. The sources of both the third Type 2 transistor and the fourth Type 2 transistor are connected to a second voltage terminal.

An inverter receives voltage at the first input terminal and transmits a logically opposite signal to the second input terminal. When the voltage at the first input terminal is logically low, the voltage at the second input terminal will be logically high. In this way, the third Type 2 transistor and the fourth Type 2 transistor will correspondingly conduct and cut-off, respectively. Furthermore, the first Type 1 transistor, the third Type 1 transistor, and the first Type 2 transistor will conduct simultaneously so that the voltage at the second output terminal is substantially equal to the voltage of the first voltage terminal.

The gate of the second Type 1 transistor is connected to the conducting third Type 1 transistor. In this way, the second Type 1 transistor does not conduct because the voltage of the second Type 1 transistor is substantially equal to that of the first voltage terminal and logically high. This shows that the voltages at the first output terminal and the second output terminal are controlled by the voltages at the first input terminal and the second input terminal, wherein the voltages at the first output terminal and the second output are logically low (same as the second voltage terminal) and logically high (same as the first voltage terminal) respectively.

On the other hand, when the voltage at the first input terminal is logically high, the voltage at the second input terminal is opposite to that of the first input terminal and logically low. In this way, the third Type 2 transistor and the fourth Type 2 transistor conduct and cut-off respectively. The second Type 1 transistor, the fourth Type 1 transistor, and the second Type 2 transistor conduct so that the voltage at the first output terminal is substantially equal to that of the first voltage terminal and logically high.

The gate of the first Type 1 transistor is connected to the conducting fourth Type 1 transistor. In this way, the first Type 1 transistor does not conduct because the voltage of the first Type 1 transistor is substantially equal to that of the first voltage terminal and logically high. Therefore, the voltages at the first output terminal and the second output terminal are again controlled by the voltages at the first input terminal and the second input terminal, wherein the voltages at the first output terminal and the second output terminal are logically low (same as the second voltage terminal) and logically high (same as the first voltage terminal) respectively.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

This invention relates to a level shifter that can output signals with increased voltage but at the same logic level, based on the input signal received. This invention specifically relates to a level shifter that receives a high level input signal and a low level input signal and then generates a high voltage output signal and a low voltage output signal simultaneously.

Figure 1:
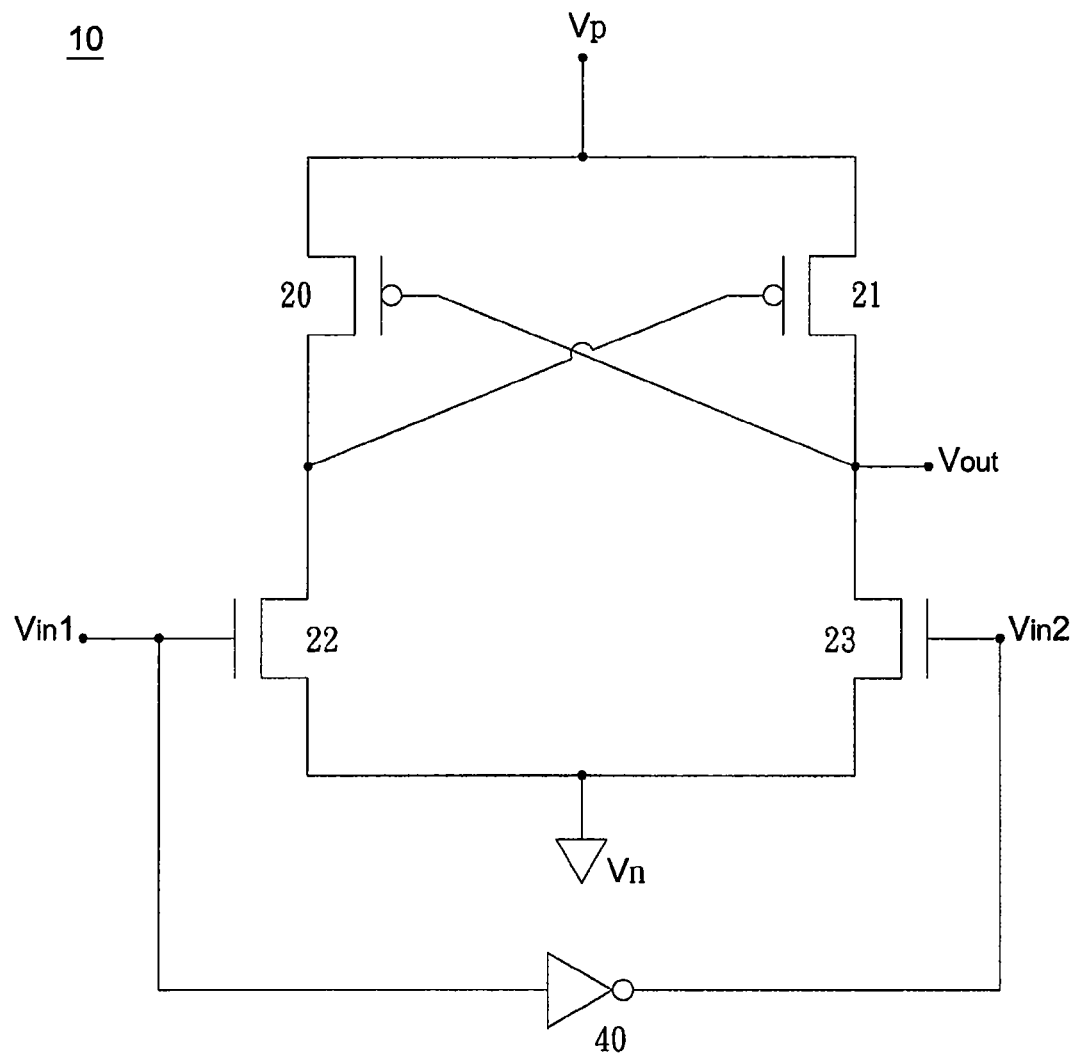
FIG. 1 is a circuit diagram of a conventional level shifter.
Figure 2:
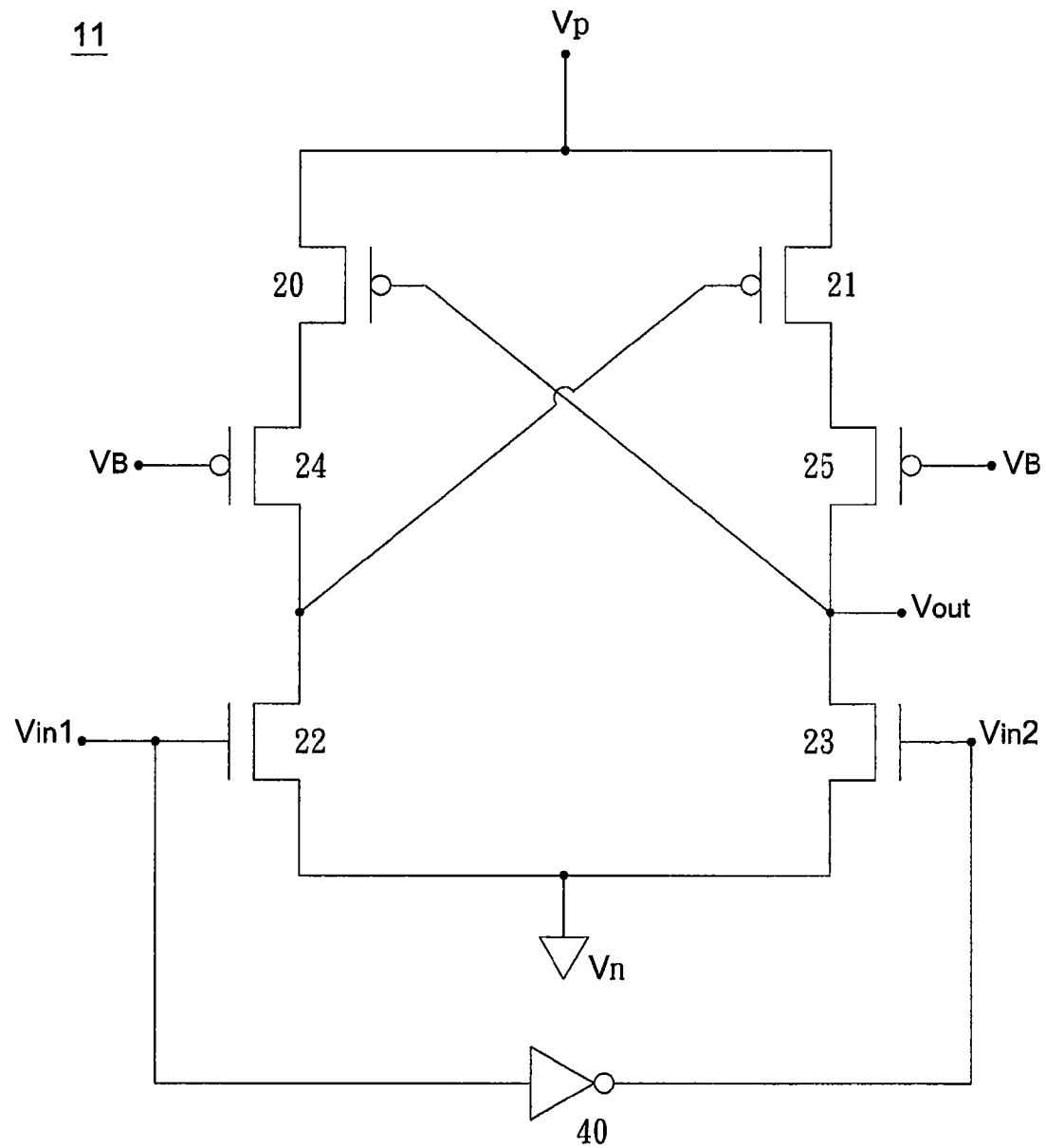
FIG. 2 is a circuit diagram of another conventional level shifter.
Figure 3:
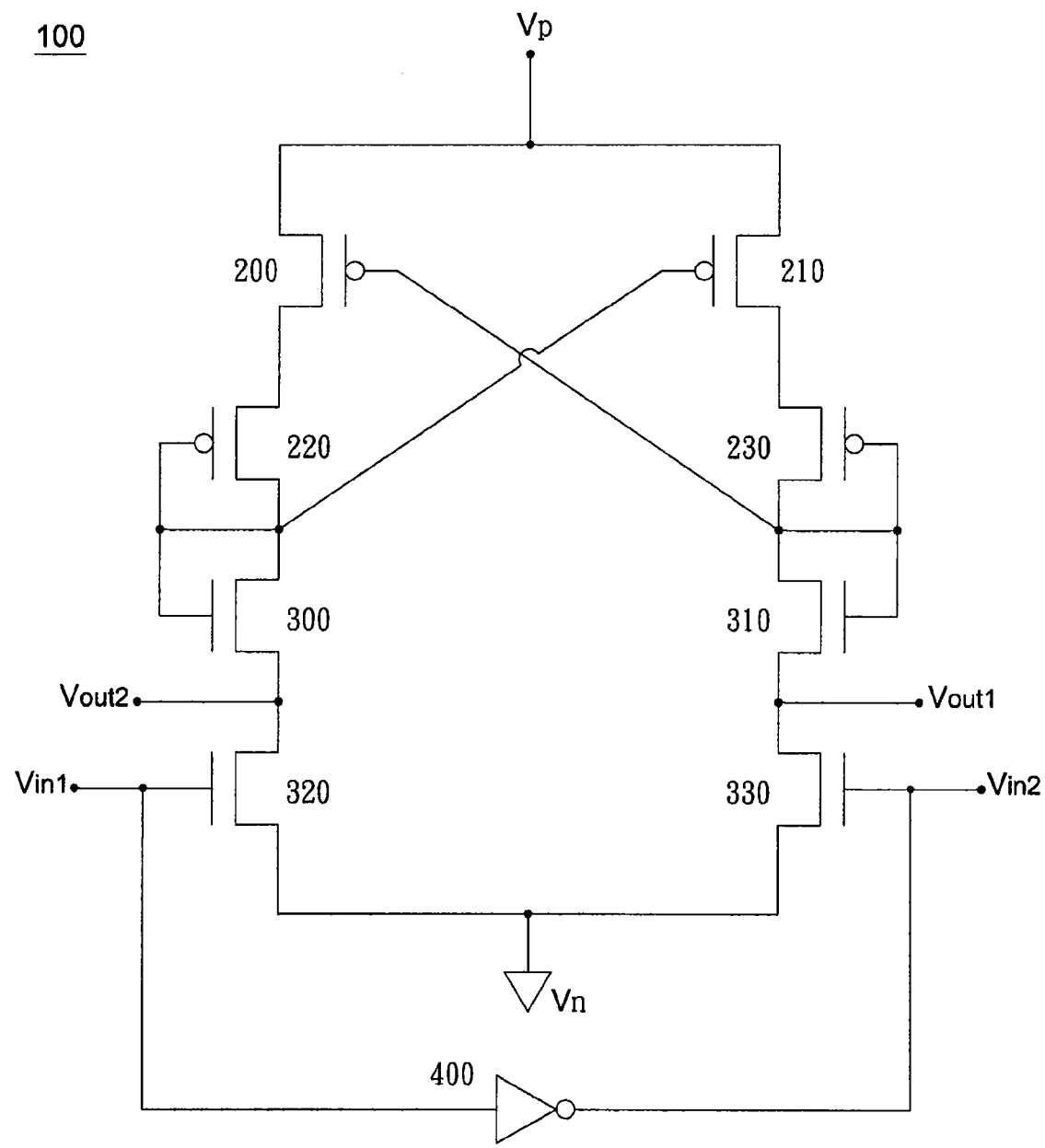
FIG. 3 is a circuit diagram of the level shifter in one embodiment of the present invention.

FIG. 3 is a circuit diagram of the level shifter in one embodiment of the present invention. The level shifter 100 preferably includes a plurality of Type 1 transistors and a plurality of Type 2 transistors, wherein the Type 1 transistors and the Type 2 transistors are preferably P-Type Metal-Oxide-Semiconductor Field-Effect Transistors (PMOS-FETs) and respectively, but are not limited thereto. In different embodiments, the level shifter 100 can include other types of the transistors or electronic switches.

In the embodiment illustrated in FIG. 3, the Type 1 transistors include a first Type 1 transistor 200, a second Type 1 transistor 210, a third Type 1 transistor 220, and a fourth Type 1 transistor 230. As FIG. 3 shows, the sources of the first Type 1 transistor 200 and the second Type 1 transistor 210 are both connected to a first voltage terminal Vp. The source of the third Type 1 transistor 220 is connected to the drain of the first Type 1 transistor 200. The gate and the drain of the third Type 1 transistor 220 are connected to the gate of the second Type 1 transistor 210. Furthermore, the source of the fourth Type 1 transistor 230 is connected to the drain of the second Type 1 transistor 210. The gate and the drain of the fourth Type 1 transistor 230 are connected to the gate of the first Type 1 transistor 200.

On the other hand, the Type 2 transistors include a first Type 2 transistor 300, a second Type 2 transistor 310, a third Type 2 transistor 320, and a fourth Type 2 transistor 330. The drain and the gate of the first Type 2 transistor 300 are connected to the drain and the gate of the third Type 1 transistor

220. The drain and the gate of the second Type 2 transistor 310 are connected to the drain and the gate of the fourth Type 1 transistor 230. The drain and the gate of the third Type 2 transistor 320 are connected to the source of the first Type 2 transistor 300 and a first input terminal Vin1, respectively. The drain and the gate of the fourth Type 2 transistor 330 are connected to the source of the second Type 2 transistor and a second input terminal Vin2, respectively. Furthermore, the sources of the third Type 2 transistor 320 and the fourth Type 2 transistor 330 are electrically connected to a second voltage terminal Vn.

In the embodiment illustrated in FIG. 3, the source of the second Type 2 transistor 310 and the drain of the fourth Type 2 transistor 330 are connected to a first output terminal Vout1 of the level shifter 100. On the other hand, the source of the first Type 2 transistor 300 and the drain of the third Type 2 transistor 320 are connected to a second output terminal Vout2 of the level shifter 100.

In the embodiment illustrated in FIG. 3, the digital signal inputted into the first input terminal Vin1 can be located at a logically high or logically low level, wherein the inverter 400 will output an electrical signal, with polarity opposite to that of the signal inputted into the first input terminal Vin1, to the gate of the fourth Type 2 transistor 330 and the second input terminal Vin2. For instance, when the voltage at the first input terminal Vin1 is logically high, the inverter 400 will input a logically low signal to the gate of the fourth Type 2 transistor 330 and vice versa. In this way, the gate of the third Type 2 transistor 320 and the gate of the fourth Type 2 transistor 330 will not receive signals with the same polarity.

Furthermore, in the embodiment illustrated in FIG. 3, the voltage levels at the first voltage terminal Vp and the second voltage terminal Vn are 15 volts and 0 volt respectively, but are not limited thereto; in different embodiments, the first voltage terminal Vp and the second voltage terminal Vn can be connected to the ground, the power source or have other voltages.

In the embodiment illustrated in FIG. 3, when the voltage at the first input terminal Vin1 is logically low, the voltage at the second input terminal Vin2 will be logically high because the input terminal of the inverter 400 is connected to the first input terminal Vin1. In this way, the third Type 2 transistor 320 will be cut-off while the fourth Type 2 transistor 330 conducts. Therefore, the voltage at the second output terminal Vout2 will be logically high because the third Type 2 transistor 320 is cut-off. The voltage at the first output terminal Vout1 will be pulled to that of the second voltage terminal Vn because the fourth Type 2 transistor 330 conducts.

On the other hand, when the voltage at the first input terminal Vin1 is logically high, the voltage at the second input terminal Vin2 will be logically low because the input terminal of the inverter 400 is connected to the first input terminal Vin1. In this way, the third Type 2 transistor 320 will conduct while the fourth Type 2 transistor 330 cut-offs. The voltage at the first output terminal Vout1 will be logically high because the third Type 2 transistor 330 is cut-off. The voltage at the second output terminal Vout2 will be pulled to that of the second voltage terminal Vn because the third Type 2 transistor 320 conducts.

Figure 4:
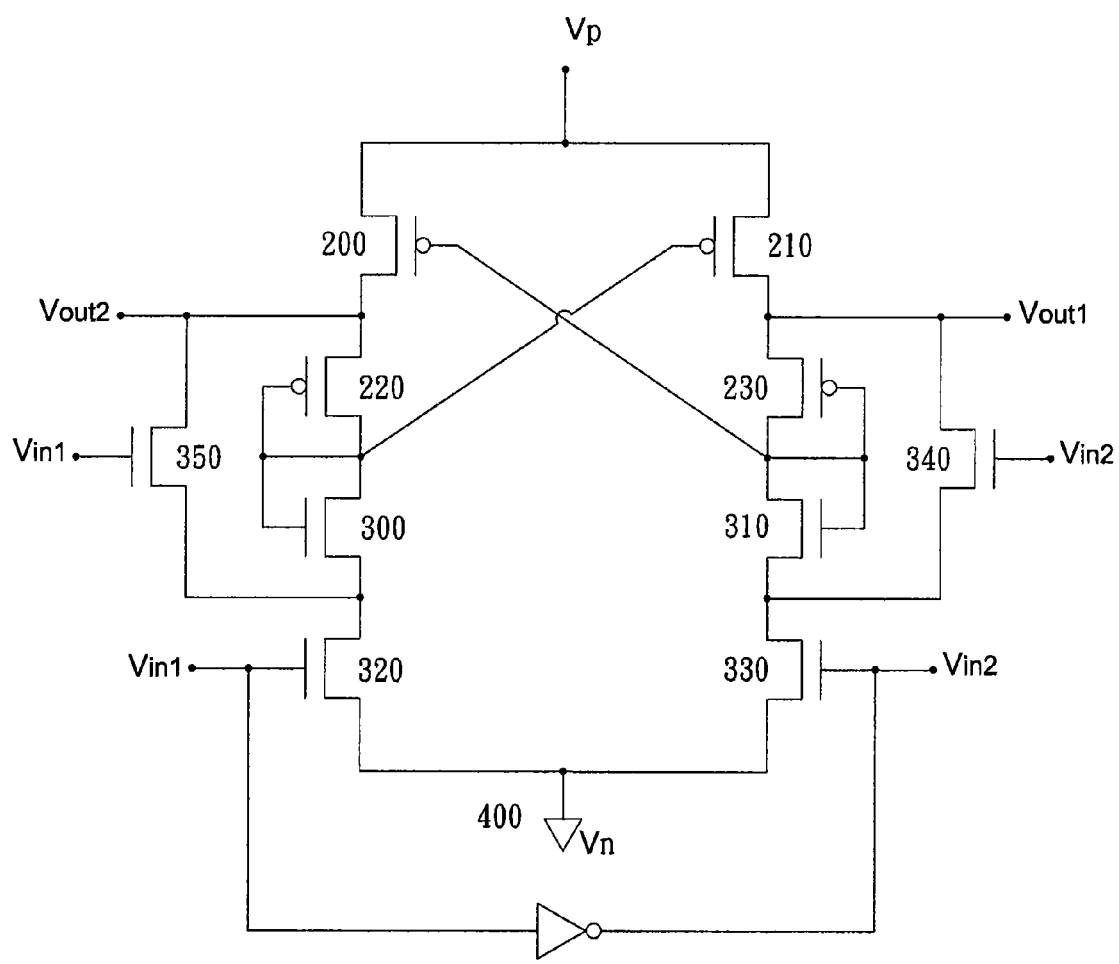
FIG. 4 is a variation of the level shifter illustrated in FIG. 3.

FIG. 4 illustrates a variation of the level shifter 100 illustrated in FIG. 3. The level shifter 100 of the present embodiment further includes a fifth Type 2 transistor 340 and a sixth Type 2 transistor 350. As FIG. 4 shows, the gate of the fifth Type 2 transistor 340 is connected to the second input terminal Vin2. Furthermore, the drain of the fifth Type 2 transistor 340 is connected to the drain of the second Type 1 transistor 210, the source of the fourth Type 1 transistor 230, and the first output terminal Vout1. Furthermore, the source of the fifth Type 2 transistor 340 is connected to the source of the second Type 2 transistor 310 and the drain of the fourth Type 2 transistor 330.

On the other hand, the gate of the sixth Type 2 transistor 350 is connected to the first input terminal Vin1. The drain of the sixth Type 2 transistor 350 is connected to the drain of the first Type 1 transistor 200, the source of the third Type 1 transistor 220, and the second output terminal Vout2. Furthermore, the source of the sixth Type 2 transistor 350 is connected to the source of the first Type 2 transistor 300 and the drain of the third Type 2 transistor 320.

In the embodiment illustrated in FIG. 4, when the voltage inputted into the first input terminal Vin1 is logically low, the third Type 2 transistor 320 and the fifth Type 2 transistor 340 will be cut-off. In this way, the voltage at the second output terminal Vout2 will be pulled up to that of the first voltage terminal Vp because the third Type 2 transistor 320 and the fifth Type 2 transistor 340 are both cut-off and do not conduct. On the other hand, the voltage at the second input terminal Vin2 will be logically high because the input terminal of the inverter 400 is connected to the first input terminal Vin1. In this way, the fourth Type 2 transistor 330 and the fifth Type 2 transistor 340 will conduct because their gates are connected to the second input terminal Vin2 and thus the voltage of the first output terminal Vout1 will be pulled to that of the second voltage terminal Vn.

On the other hand, when the voltage inputted into the first input terminal Vin1 is logically high, the third Type 2 transistor 320 and the fifth Type 2 transistor 340 will both conduct and the voltage at the second output terminal Vout2 will be pulled down to that of the second voltage terminal. Furthermore, the voltage at the second input terminal Vin2 will be logically low because the input terminal of the inverter 400 is connected to the first input terminal Vin1. In this way, the fourth Type 2 transistor 330 and the fifth Type 2 transistor 340 will both be cut-off because their gates are connected to the second input terminal Vin2. The voltage at the first output terminal Vout1 will be pulled up to that of the first voltage terminal Vp because the fourth Type 2 transistor 330 and the fifth Type 2 transistor 340 are both cut-off.

Figure 5:
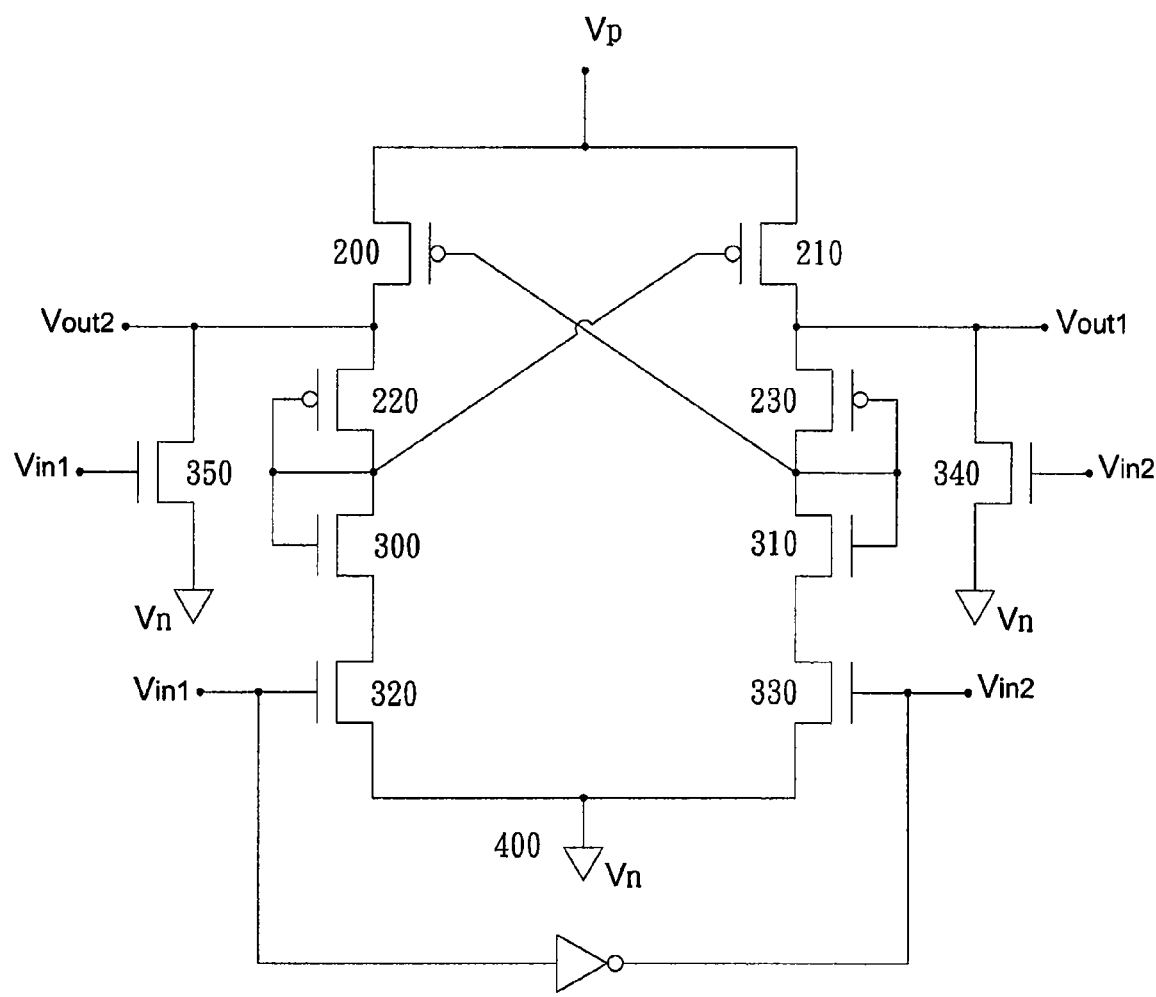
FIG. 5 is a variation of the level shifter illustrated in FIG. 4.

FIG. 5 illustrates another variation of the level shifter 100 illustrated in FIG. 4. In the embodiment illustrated in FIG. 5, the sources of both the fifth Type 2 transistor 340 and the sixth Type 2 transistor are connected to the second voltage terminal Vn. Other than that, the structures and the operations of the level shifters 100 illustrated in FIG. 4 and FIG. 5 are substantially the same and thus are not elaborated here.

Figure 6:
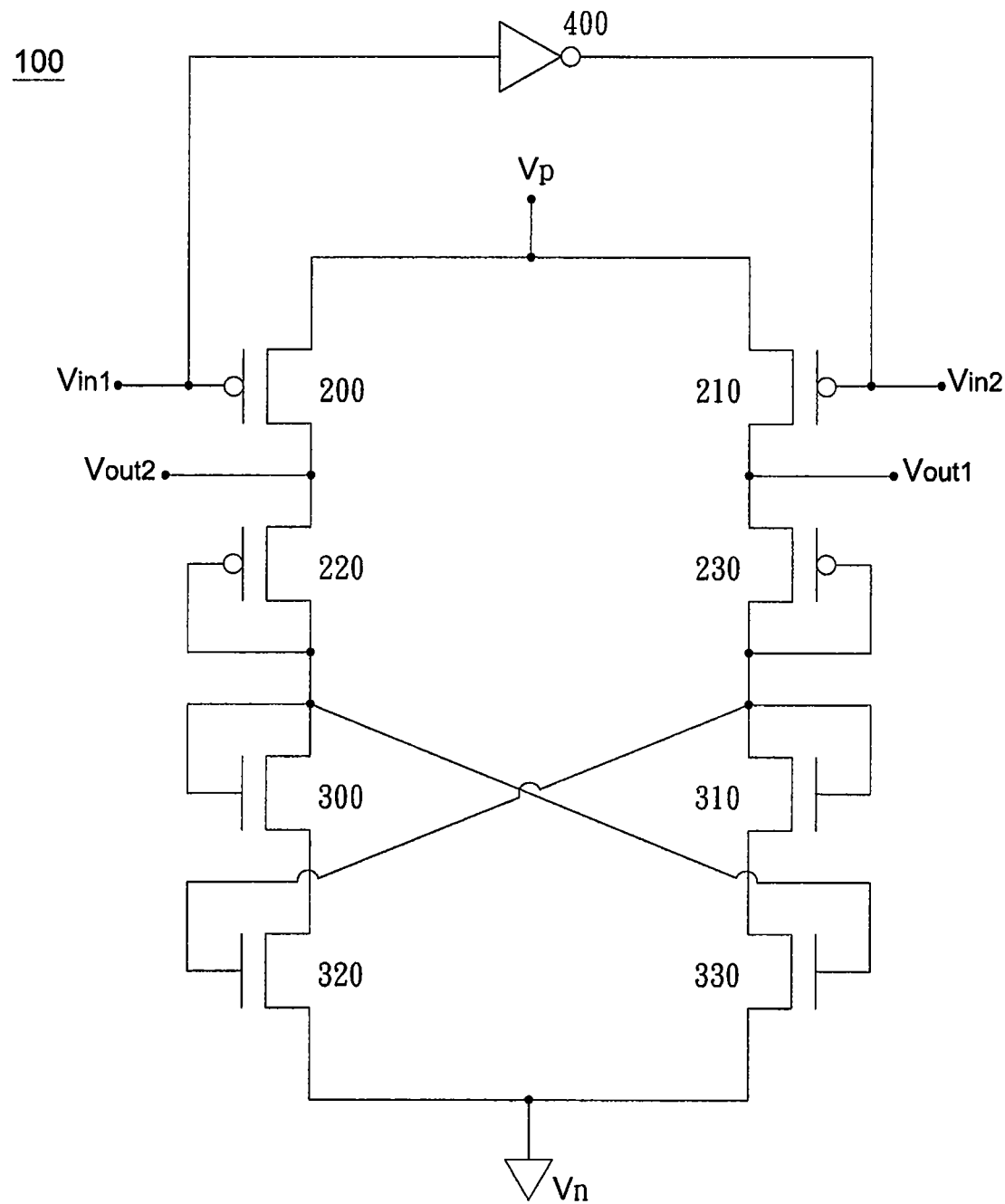
FIG. 6 is a circuit diagram of the level shifter in another embodiment of the present invention.

FIG. 6 illustrates another embodiment of the level shifter 100 of the present invention. As FIG. 6 shows, the gates of the first Type 1 transistor 200 and the second Type 1 transistor 210 are connected to the first input terminal Vin1 and the second input terminal Vin2, respectively. In other words, the gates of the first Type 1 transistor 200 and the second Type 1 transistor 210 receive digital signals with different polarities.

In the embodiment illustrated in FIG. 6, the source of the third Type 1 transistor 220 is connected to the drain of the first Type 1 transistor 200. The gate and the drain of the third Type 1 transistor 220 are electrically connected. Furthermore, the source of the fourth Type 1 transistor 230 is connected to the drain of the second Type 1 transistor 210. The gate and the drain of the fourth Type 1 transistor 230 are electrically connected.

The gate and the drain of the first Type 2 transistor 300 are both electrically connected to the drain of the third Type 1 transistor 220. The gate and the drain of the second Type 2 transistor 310 are connected to the drain of the fourth Type 1 transistor 230. On the other hand, the gate of the third Type 2 transistor 320 is connected to the drain and the gate of the second Type 2 transistor 310. The drain of the third Type 2 transistor 320 is connected to the source of the first Type 2 transistor 300. The gate of the fourth Type 2 transistor 330 is connected to the drain and the gate of the first Type 2 transistor 310. The drain of the fourth Type 2 transistor 330 is connected to the source of the second Type 2 transistor 310. Furthermore, the sources of the third Type 2 transistor 320 and the fourth Type 2 transistor 330 are both connected to the second voltage terminal.

Furthermore, as FIG. 6 shows, the drain of the second Type 1 transistor 210 and the source of the fourth Type 1 transistor 230 are connected to the first output terminal Vout1 of the level shifter 100 of the present embodiment. The drain of the first Type 1 transistor 200 and the source of the third Type 1 transistor 220 are connected to the second output terminal Vout2 of the level shifter 100.

In the embodiment illustrated in FIG. 6, when the voltage at the first input terminal Vin1 is logically low, the voltage at the second input terminal Vin2 will be logically high because the input terminal of the inverter 400 is connected to the first input terminal Vin1. In this way, the first Type 1 transistor 200 and the second Type 1 transistor 210 will conduct and cut-off, respectively. The fourth Type 1 transistor 230, the second Type 2 transistor 310, and the fourth Type 2 transistor 330 will all conduct so that the voltage at the first output terminal Vout1 will be pulled down to that of the second voltage terminal Vn.

The third Type 2 transistor 320 will be cut-off as its gate is connected to the second Type 2 transistor 310 at logically low voltage. In this way, the voltage at the second output terminal Vout2 will be pulled up to that of the first voltage terminal Vp.

On the other hand, when the voltage inputted into the first input terminal Vin1 is logically high, the voltage at the second input terminal Vin2 will be logically low as the input terminal of the inverter 400 is connected to the first input terminal Vin1. Therefore, the first Type 1 transistor 200 and the second Type 1 transistor 210 will cut-off and conduct, respectively. Furthermore, the third Type 1 transistor 220, the first Type 2 transistor 300, and the fourth Type 2 transistor 330 will all conduct so that the voltage at the second output terminal Vout2 is pulled down to that of the second voltage terminal Vn. Furthermore, the fourth Type 2 transistor 330 will be cut-off as its gate is connected to the first Type 2 transistor 300 with logically low voltage and therefore does not conduct. In this way, the voltage at the first output terminal Vout1 will be pulled up to that of the first voltage terminal Vp.

Figure 7:
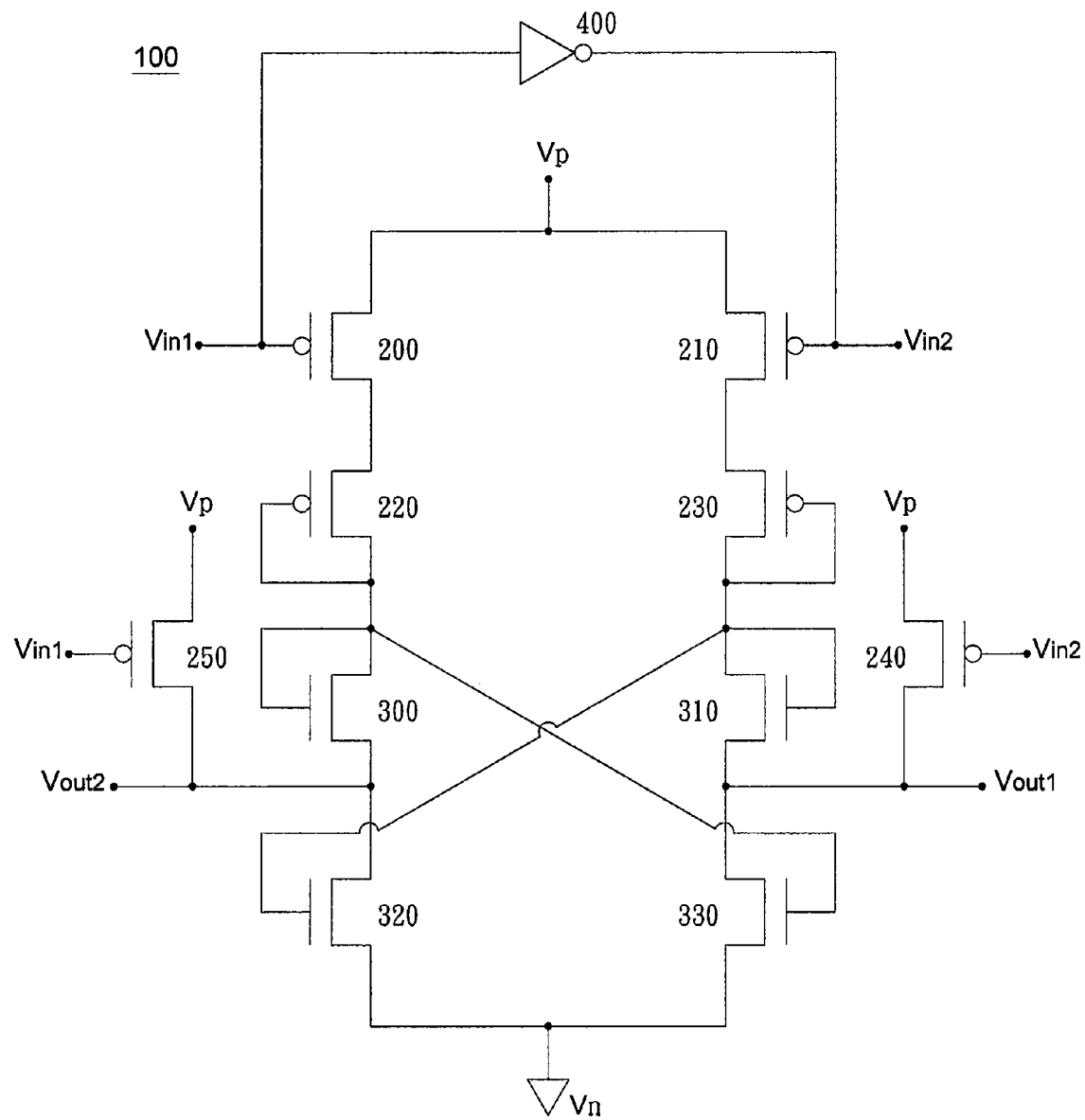
FIG. 7 and FIG. 8 are circuit diagrams illustrating variations of the level shifter illustrated in FIG. 6.

FIG. 7 illustrates a variation of the level shifter 100 illustrated in FIG. 6. The level shifter 100 of the present embodiment includes a fifth Type 1 transistor 240 and a sixth Type 1 transistor 250. As FIG. 7 shows, the source and the gate of the fifth Type 1 transistor 240 are connected to the first voltage terminal Vp and the second input terminal Vin2, respectively. The drain of the fifth Type 1 transistor 240 is connected to the source of the second Type 2 transistor 310 and the drain of the fourth Type 2 transistor 330.

Furthermore, the source and the gate of the sixth Type 1 transistor 250 are connected to the first voltage terminal Vp and the first input terminal Vin1, respectively. The drain of the sixth Type 1 transistor 250 is connected to the source of the first Type 2 transistor 300 and the drain of the third Type 2 transistor 320.

In the present embodiment, when the voltage at the first input terminal Vin1 is logically low, the first Type 1 transistor 200 and the sixth Type 1 transistor 250 will conduct as their gates are connected to the first input terminal Vin1. In this way, the voltage at the second output terminal Vout2 is pulled up to that of the first voltage terminal Vp because the sixth Type 1 transistor 250 conducts.

Furthermore, the voltage at the second input terminal Vin2 is pulled up to a logically high level because of the input terminal of the inverter 400 is connected to the first input terminal Vin1. The second Type 1 transistor 210 and the fifth Type 1 transistor 240 are cut-off and do not conduct as their gates are connected to the second input terminal Vin2. Furthermore, the fourth Type 2 transistor 330 conducts as its gate is connected to the first Type 2 transistor 300 with logically high voltage and therefore the voltage at the first output terminal Vout1 is pulled down to that of the second voltage terminal.

On the other hand, when the voltage inputted into the first input terminal Vin1, the first Type 1 transistor 200 and the sixth Type 1 transistor 250 will be cut-off as their gates are connected to the first input terminal Vin1. Furthermore, the voltage at the second input terminal Vin2 is pulled down to a logically low level because the input terminal of the inverter 400 is connected to the first input terminal Vin1. The second Type 1 transistor 210 and the fifth Type 1 transistor 240 conduct as their gates are connected to the second input terminal Vin2. The voltage at the first output terminal Vout1 is pulled up to that of the first voltage terminal Vp because the fifth Type 1 transistor 240 conducts. The voltage at the second output terminal Vout1 is pulled down to that of the second voltage terminal Vn because the third Type 2 transistor 320 conducts as its gate is connected to the second Type 2 transistor 310 with logically high voltage.

Figure 8:
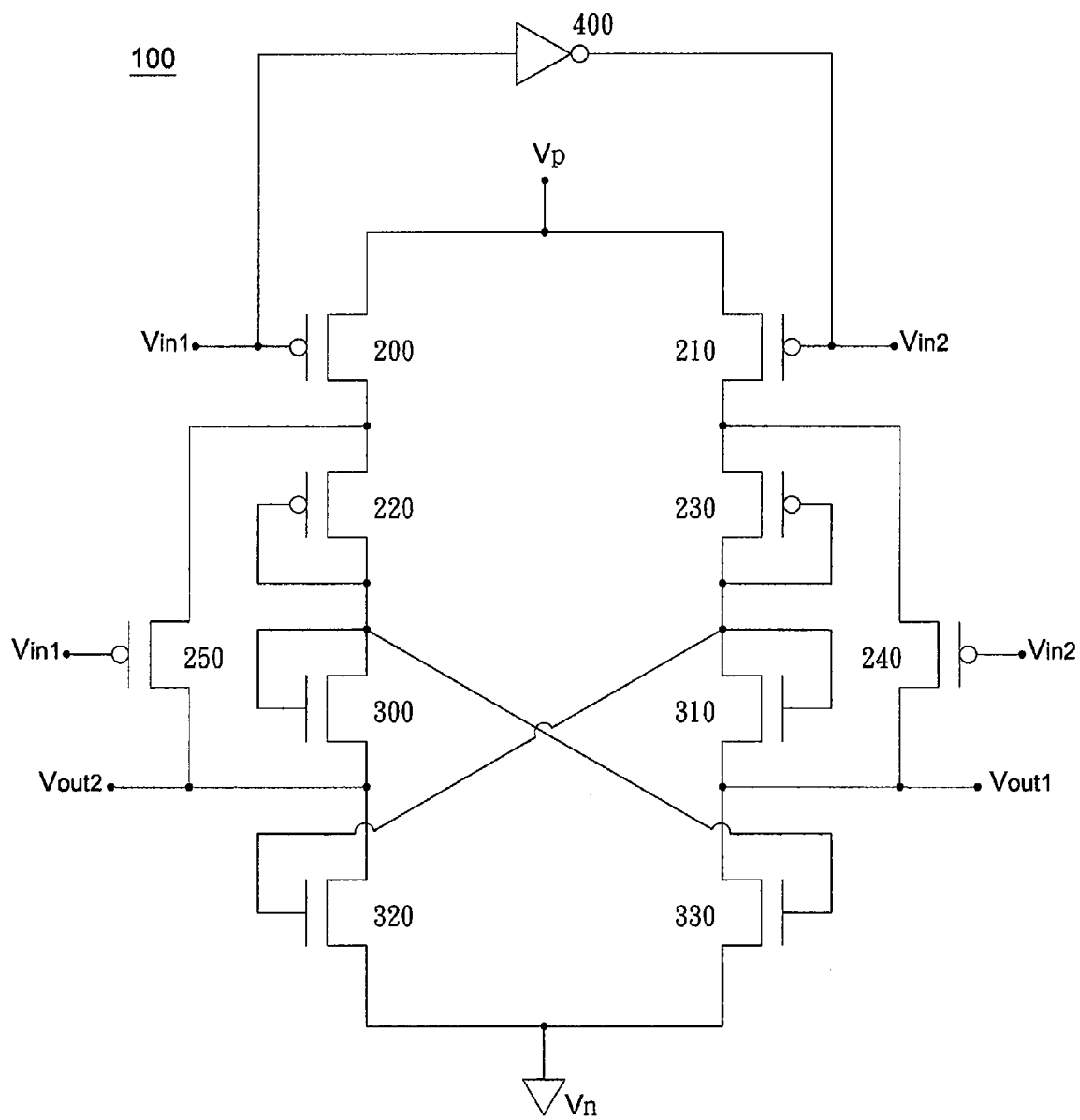

FIG. 8 illustrates a variation of the level shifter 100 illustrated in FIG. 7. As FIG. 8 shows, the gate of the fifth Type 1 transistor 240 is connected to the second input terminal Vin2. The source of the fifth Type 1 transistor 240 is connected to the drain of the second Type 1 transistor 210 and the source of the fourth Type 1 transistor 230. Furthermore, the drain of the fifth Type 1 transistor 240 is connected to the source of the second Type 2 transistor 310, the drain of the fourth Type 2 transistor 330, and the first output terminal Vout1 of the level shifter 100 in the present embodiment.

On the other hand, the gate of the sixth Type 1 transistor 250 is connected to the first input terminal Vin1. The source of the sixth Type 1 transistor 250 is connected to the drain of the first Type 1 transistor 200 and the source of the third Type 1 transistor 220. The source of the sixth Type 1 transistor 250 is connected to the source of the first Type 2 transistor 300, the drain of the third Type 2 transistor 320, and the second output terminal Vout2 of the level shifter 100.

In the embodiment illustrated in FIG. 8, when the first input terminal Vin1 accepts a logically low signal, the first Type 1 transistor 200 and the sixth Type 1 transistor 250 will conduct as their gates are connected to the first input terminal Vin1. In the mean time, the voltage at the second output terminal Vout2 is pulled up to that of the first voltage terminal Vp because the first Type 1 transistor 200 and the sixth Type 1 transistor 250 conduct.

Furthermore, the voltage at the second input terminal Vin2 is pulled up to a logically high level because the input terminal of the inverter 400 is connected to the first input terminal Vin1. The second Type 1 transistor 210 and the fifth Type 1 transistor 240 are cut-off and do not conduct as their gates are connected to the second input terminal Vin2. However, the fourth Type 2 transistor 330 conducts as its gate is connected to the third Type 1 transistor 220 and the first Type 2 transistor 300 with logically high voltages. The voltage at the first output terminal Vout1 is pulled down to that of the second voltage terminal Vn.

On the other hand, when the first input terminal Vin1 receives a logically high signal, the first Type 2 transistor 200 and the sixth Type 1 transistor 250 are cut-off as their gates are connected to the first input terminal Vin1. The voltage at the second input terminal Vin2 is pulled down to a logically low level because the input terminal of the inverter 400 is connected to the first input terminal Vin1. The voltage at the first output terminal Vout1 is pulled up to that of the first voltage terminal Vp because the second Type 1 transistor 210 and the fifth Type 1 transistor 240 conduct as their gates are connected to the second input terminal Vin2.

The third Type 2 transistor 320 conducts as its gate is connected to the fourth Type 1 transistor 230 and the second Type 2 transistor 310 with logically high voltages. The conduction of the third Type 2 transistor 320 also pulls the voltage at the second output terminal Vout 2 down to that of the second voltage terminal Vn.

Figure 9:
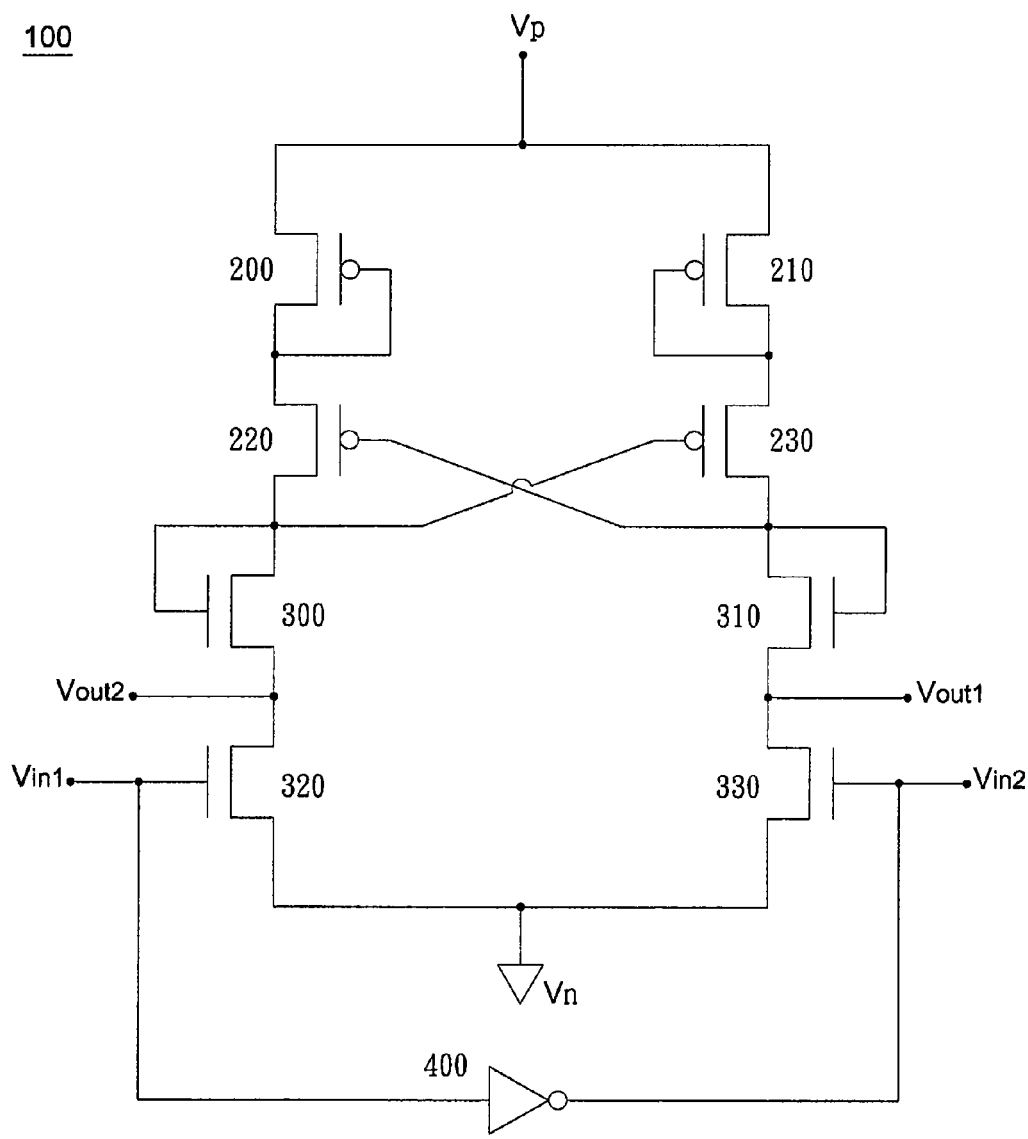
FIG. 9 is a circuit diagram of the level shifter in yet another embodiment of the present invention.

FIG. 9 illustrates another embodiment of the level shifter 100 of the present invention. In the present embodiment, the gate and the drain of the first Type 1 transistor 200 are connected. Similarly, the gate and the drain of the second Type 1 transistor 210 are connected to each other. Furthermore, the sources of the first Type 1 transistor 200 and the second Type 1 transistor 210 are both connected to the first voltage terminal Vp. The source of the third Type 1 transistor 220 is connected to the drain and the gate of the first Type 1 transistor 200. The source of the fourth Type 1 transistor 230 is connected to the drain and the gate of the second Type 1 transistor 210.

Furthermore, the drain and the gate of the first Type 2 transistor 300 are interconnected and are both connected to the drain of the third Type 1 transistor 220 as well as the gate of the fourth Type 1 transistor 230. Similarly, the drain and the gate of the second Type 2 transistor 310 are interconnected and both are also connected to the drain of the fourth Type 1 transistor 230 and the gate of the third Type 1 transistor 220. Furthermore, the drain and the gate of the third Type 2 transistor 320 are connected to the source of the first Type 2 transistor 300 and the first input terminal Vin1, respectively. The drain and the gate of the fourth Type 2 transistor 330 are connected to the source of the second Type 2 transistor 310 and the second input terminal Vin2 respectively. Furthermore, the sources of the third Type 2 transistor 320 and the fourth Type 2 transistor 330 are both connected to the second voltage terminal Vn.

In addition, the source of the second Type 2 transistor 310 and the drain of the fourth Type 2 transistor 330 are connected to the first output terminal Vout1 of the level shifter 100. The source of the first Type 1 transistor 300 and the drain of the third Type 2 transistor 320 are connected to the second output terminal Vout2.

In the embodiment illustrated in FIG. 9, when the first input terminal Vin1 receives a logically low signal, the voltage at the second input terminal Vin2 is logically high because the input terminal of the inverter 400 is connected to the first input terminal Vin1. In this way, the third Type 2 transistor 320 will be cut-off while the fourth Type 2 transistor 330 conducts. The voltage at the first output terminal Vout1 is pulled down to that of the second voltage terminal Vn because the fourth Type 2 transistor 330 conducts. The voltage at the second output terminal Vout2 is pulled up to that of the first voltage terminal Vp because the third Type 2 transistor is cut-off and does not conduct.

On the other hand, when the voltage at the first input terminal Vin1 is logically high, the voltage at the second input end Vin2 will be logically low as the input terminal of the inverter 400 is connected to the first input terminal Vin1. In this way, the third Type 2 transistor 320 will conduct while the fourth Type 2 transistor 330 cut-off. Thus, the voltage at the first output terminal Vout1 is pulled up to that of the first voltage terminal Vp because the fourth Type 2 transistor 330 does is cut-off and does not conduct. Furthermore, the voltage at the second output terminal Vout2 is pulled down to that of the second voltage terminal Vn because the third Type 2 transistor 320 conducts.

Figure 10:
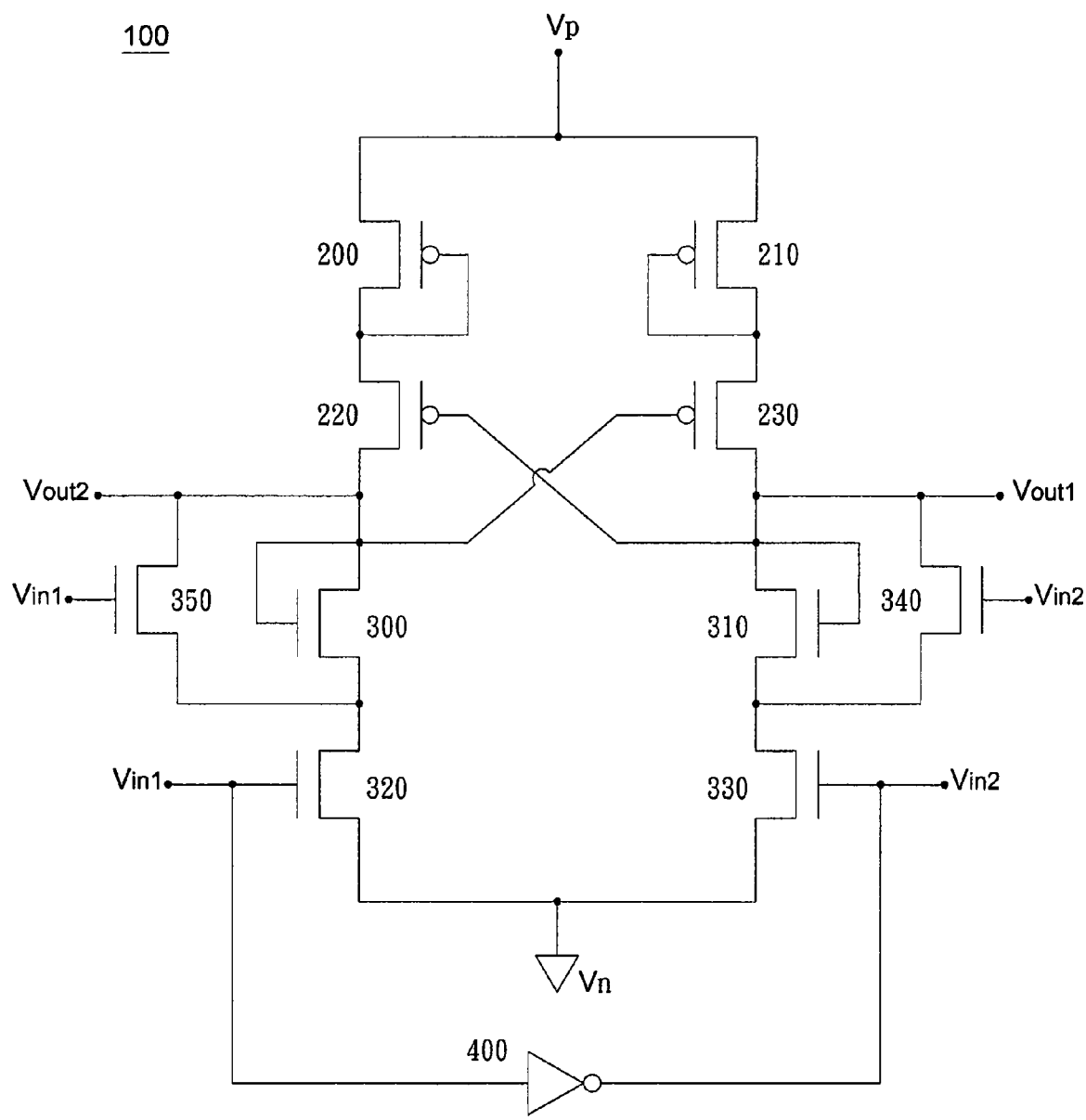
FIG. 10 and FIG. 11 are circuit diagrams illustrating variations of the level shifter illustrated in FIG. 9.

FIG. 10 illustrates a variation of the level shifter 100 illustrated in FIG. 9. The level shifter 100 of the present embodiment includes a fifth Type 2 transistor 340 and a sixth Type 2 transistor 350. The gate of the fifth Type 2 transistor 340 is connected to the second input terminal Vin2. The drain of the fifth Type 2 transistor 340 is connected to the drain of the fourth Type 1 transistor 230, the drain of the second Type 2 transistor 310, and the first output terminal Vout1. The source of the fifth Type 2 transistor 340 is connected to the source of the second Type 2 transistor 310 and the drain of the fourth Type 2 transistor 330.

On the other hand, the gate of the sixth Type 2 transistor 350 is connected to the first input terminal Vin1. The drain of the sixth Type 2 transistor 350 is connected to the drain of the third Type 1 transistor 220, the drain of the first Type 2 transistor 300, and the second output terminal Vout2. Furthermore, the source of the sixth Type 2 transistor 350 is connected to the source of the first Type 2 transistor 300 and the drain of the third Type 2 transistor 320.

In the embodiment illustrated in FIG. 10, when the first input terminal Vin1 accepts a logically low signal, the third Type 2 transistor 320 and the sixth Type 2 transistor 350 will be cut-off as their gates are connected to the first input terminal Vin1. In this way, the voltage at the second output terminal Vout2 will be pulled up to that of the first voltage terminal Vp because the third Type 2 transistor 320 is cut-off and does not conduct.

Furthermore, the voltage at the second input terminal Vin2 is logically low because the input terminal of the inverter 400 is connected to the first input terminal Vin1. Therefore, the fourth Type 2 transistor 330 and the fifth Type 2 transistor 340 will conduct as their gates are connected to the second input terminal Vin2, wherein the voltage at the first output terminal Vout1 will be pulled down to that of the second voltage terminal Vn because both the fourth Type 2 transistor 330 and the fifth Type 2 transistor 340 conduct.

On the other hand, when the first input terminal Vin1 receives a logically high signal, the third Type 2 transistor 320 and the sixth Type 2 transistor 350 conduct as both of their gates are connected to the first input terminal Vin1 and pull the voltage at the second output terminal Vout2 down to that of the second voltage terminal Vn.

In addition, the voltage at the second input terminal Vin2 is pulled down to that of the second voltage terminal Vn because the input terminal of the inverter 400 is connected to the first input terminal Vin1. In this way, the fourth Type 2 transistor 330 and the fifth Type 2 transistor 340 are cut-off as their gates are connected to the second input terminal Vin2. The voltage at the first output terminal is pull up to that of the first voltage terminal because both the fourth Type 2 transistor 330 and the fifth Type 2 transistor 340 are cut-off and do not conduct.

Figure 11:
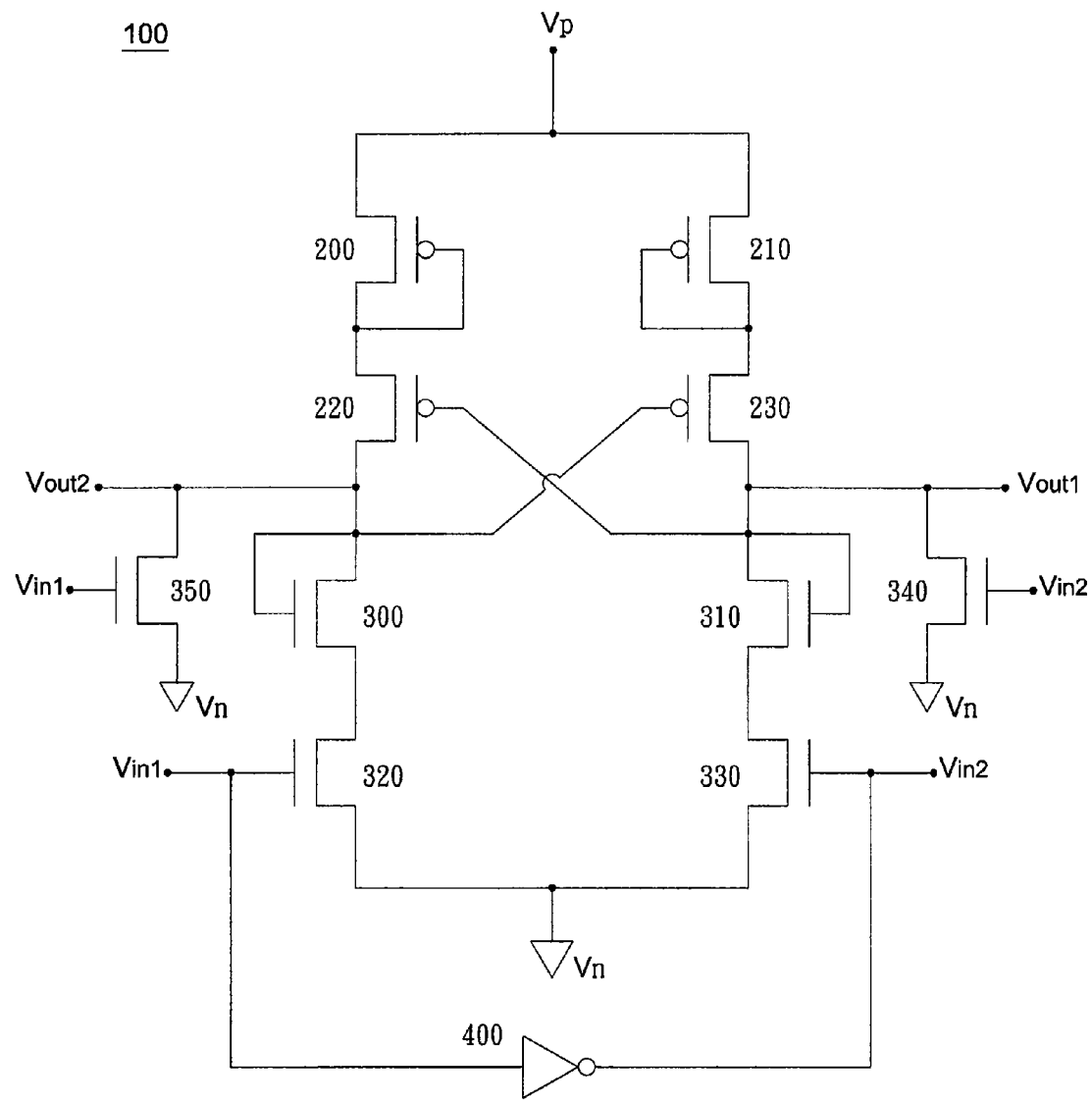

FIG. 11 illustrates a variation of the level shifter 100 illustrated in FIG. 10. In the embodiment illustrated in FIG. 11, both sources of the fifth Type 2 transistor 340 and the sixth Type 2 transistor 350 are connected to the second voltage terminal Vn.

In the embodiment illustrated in FIG. 11, when the first input terminal Vin1 receives a logically low signal, both the third Type 2 transistor 320 and the sixth Type 2 transistor 350 are cut-off as their gates are connected to the first input terminal Vin1 and therefore the voltage at the second output terminal Vout2 is pulled up to that of the first voltage terminal Vp.

Furthermore, the voltage at the second input terminal Vin2 is pulled up to that of the first voltage terminal Vp because the input terminal of the inverter 400 is connected to the first input terminal Vin1. In this way, both the fourth Type 2 transistor 330 and the fifth Type 2 transistor 340 will conduct as their gates are connected to the second input terminal Vin2, wherein the voltage at the first output terminal Vout1 is pulled down to that of the second voltage terminal Vn because both the fourth Type 2 transistor 330 and the fifth Type 2 transistor 340 conduct.

On the other hand, when the first input terminal Vin1 receives a logically high signal, the third Type 2 transistor 320 and the sixth Type 2 transistor 350 will conduct as their gates are connected to the first input terminal Vin1. In this way, the voltage at the second output terminal Vout2 is pulled down to that of the second voltage terminal Vn because the sixth Type 1 transistor 350 conducts.

Furthermore, the voltage at the second input terminal Vin2 is logically low because the input terminal of the inverter 400 is connected to the first input terminal Vin1, wherein the fourth Type 2 transistor 330 and the fifth Type 2 transistor 340 are cut-off as their gates are connected to the second input terminal Vin2. Both the fourth Type 2 transistor 330 and the fifth Type 2 transistor 340 connected to the second voltage terminal Vn do not conduct and therefore the voltage at the first output terminal Vout1 is equal to that of the first voltage terminal Vp.

It can be seen from the description of the embodiments illustrated from FIG. 3 to FIG. 11, the level shifter 100 of the present invention does not require any bias voltage to switch the transistors between states. Furthermore, the voltages at the first output terminal Vout1 and the second output terminal Vout2 correspond directly to that of the first voltage terminal Vp or the second voltage terminal Vn based on the conduction of the transistors and therefore the output voltage transition of the level shifter 100 of the present invention is faster than that of conventional level shifters.

The above is detailed descriptions of the particular embodiments of the invention which is not intended to limit the invention to the embodiments described. It is recognized that modifications within the scope of the invention will occur to a person skilled in the art. Such modifications and equivalents of the invention are intended for inclusion within the scope of this invention.

The invention claimed is:

1. A level shifter, comprising:
a plurality of Type 1 transistors, wherein each of the Type 1 transistors includes a source, a gate, and a drain, the Type 1 transistors include:
a first Type 1 transistor;
a second Type 1 transistor, wherein the gate of the first Type 1 transistor and the gate of the second Type 1 transistor are connected to a first input terminal and a second input terminal respectively, the sources of both the first Type 1 transistor and the second Type 1 transistor are connected to a first voltage terminal;
a third Type 1 transistor, wherein the gate and the drain of the third Type 1 transistor are interconnected, the source of the third Type 1 transistor is connected to the drain of the first Type 1 transistor; and
a fourth Type 1 transistor, wherein the gate and the drain of the fourth Type 1 transistor are interconnected, the source of the fourth Type 1 transistor is connected to the drain of the second Type 1 transistor; and
a plurality of Type 2 transistors, wherein each of the Type 2 transistors includes a source, a gate, and a drain, the Type 2 transistors include:
a first Type 2 transistor, wherein the drain and the gate of the first Type 2 transistor are interconnected and also connected to the drain of the third Type 1 transistor;
a second Type 2 transistor, wherein the drain and the gate of the second Type 2 transistor are interconnected and also connected to the drain of the fourth Type 1 transistor;
a third Type 2 transistor, wherein the drain of the third Type 2 transistor is connected to the source of the first Type 2 transistor, the gate of the third Type 2 transistor is connected to the drain and the gate of the second Type 2 transistor; and
a fourth Type 2 transistor, wherein the drain of the fourth Type 2 transistor is connected to the source of the second Type 2 transistor, the gate of the fourth Type 2 transistor is connected to the drain and the gate of the first Type 2 transistor, the sources of both the third Type 2 transistor and the fourth Type 2 transistor are connected to a second voltage terminal;
wherein the Type 1 transistors further include:
a fifth Type 1 transistor, the gate of the fifth Type 1 transistor connected to the second input terminal, the source of the fifth Type 1 transistor connected to the drain of the second Type 1 transistor and the source of the fourth Type 1 transistor, the drain of the fifth Type 1 transistor connected to the source of the second Type 2 transistor, the drain of the fourth Type 2 transistor and a first output terminal; and
a sixth Type 1 transistor, the gate of the sixth Type 1 transistor connected to the first input terminal, the source of the sixth Type 1 transistor connected to the drain of the first Type 1 transistor and the source of the third Type 1 transistor, the drain of the sixth Type 1 transistor connected to the source of the first Type 2 transistor, the drain of the third Type 2 transistor and a second output terminal.

* * * * *